US009531398B2

(12) United States Patent
Ferguson et al.

(10) Patent No.: US 9,531,398 B2
(45) Date of Patent: Dec. 27, 2016

(54) LIMITING AGING EFFECTS IN ANALOG DIFFERENTIAL CIRCUITS

(71) Applicant: ANALOG DEVICES. INC., Norwood, MA (US)

(72) Inventors: Paul F. Ferguson, North Andover, MA (US); Gabriele Manganaro, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/042,675

(22) Filed: Feb. 12, 2016

(65) Prior Publication Data
US 2016/0269038 A1    Sep. 15, 2016

Related U.S. Application Data

(60) Provisional application No. 62/131,725, filed on Mar. 11, 2015.

(51) Int. Cl.
*H03M 1/06* (2006.01)
*G01R 31/28* (2006.01)
*H03M 1/12* (2006.01)

(52) U.S. Cl.
CPC ............ *H03M 1/06* (2013.01); *G01R 31/2872* (2013.01); *H03M 1/12* (2013.01)

(58) Field of Classification Search
CPC .............................. H03K 3/011; H03K 5/2481
(Continued)

(56) References Cited

U.S. PATENT DOCUMENTS 5,621,339 A    4/1997  Kerth et al.
6,661,365 B1   12/2003 Bugeja
(Continued)

FOREIGN PATENT DOCUMENTS

EP    2629428 A1    8/2013

OTHER PUBLICATIONS

Christian C. Enz et al., *Circuit Techniques for Reducing the Effects of Op-Amp Imperfections: Autozeroing, Correlated Double Sampling, and Chopper Stabilization*, Proceedings of the IEEE, vol. 84, No. 11, Nov. 1996, 31 pages.
(Continued)

*Primary Examiner* — Peguy Jean Pierre
(74) *Attorney, Agent, or Firm* — Patent Capital Group

(57) ABSTRACT

Aging effects on devices fabricated using deep nanometer complementary metal-oxide semiconductor (CMOS) processes can cause circuits to exhibit an undesirable mismatch buildup over time. To address the aging effects, the connections to an array of M differential circuits are controlled to limit and systematically minimize or reverse the aging effects. In one embodiment, the controlling permutation sequence is selected to stress the array of M differential circuits under opposite stress conditions during at least two different time periods. Imposing opposite stress conditions, preferably substantially equal opposite stress conditions, can reverse the direction of a mismatch buildup and limit the mismatch buildup over time within acceptable limits. The controlling permutation sequence can be applied to an array of comparators of an analog-to-digital converter, or an array of differential amplifiers of a folding analog-to-digital converter.

20 Claims, 11 Drawing Sheets

(58) Field of Classification Search
USPC .......................................... 341/118, 120, 172
See application file for complete search history.

(56) References Cited

U.S. PATENT DOCUMENTS

| | | | |
|---|---|---|---|
| 7,315,178 B1 | 1/2008 | Suzuki | |
| 7,358,809 B2 | 4/2008 | Elder | |
| 7,660,691 B2 | 2/2010 | Denais | |
| 8,436,659 B1* | 5/2013 | Lim .................... | H03K 5/2481 327/206 |
| 8,578,137 B2 | 11/2013 | Abella et al. | |
| 2007/0183214 A1 | 8/2007 | Yoshinaga et al. | |
| 2008/0295605 A1 | 12/2008 | Jang et al. | |
| 2009/0051639 A1* | 2/2009 | Liu .................... | G09G 3/3677 345/92 |
| 2009/0295699 A1 | 12/2009 | Korenari et al. | |
| 2010/0220514 A1 | 9/2010 | Vigoda et al. | |
| 2012/0206281 A1 | 8/2012 | Bashirullah et al. | |
| 2014/0002160 A1* | 1/2014 | Priel .................... | H03K 3/011 327/198 |

OTHER PUBLICATIONS

Lars Evensen et al., *A Differential Pressure Sensor for Space with a Silicon MEMS Element*, 7$^{th}$ ESA Round Table on MNT for Space Applications, Presens Pressure Sensor Technology, Aug. 15, 2010, www.presens.com, 19 pages.

G. Quilligan et al., *A Radiation Hardened by Design CMOS ASIC for Thermopile Readouts*, International Workshop on Instrumentation for Planetary Missions (2012), 5 pages.

G. Quilligan et al., *A Radiation Hard ASIC for Thermal Instrumentation on the Europa Clipper Mission*, Workshop on the Habitability of Icy Worlds (2014), 1 page.

Adrian Sherry, *Chopping on Σ-Δ ADCs*, AN-609, Application Note © 2003, wwww.analog.com, 4 pages.

*Op Amp Input Offset Voltage*, MT-037 Tutorial, Rev.0, 10/08, WK, © 2009, www.analog.com, 10 pages.

Keith Jordy, *Low-Power Amplifier Chopper Stabilizer for a Digital-to-Analog Converter*, MIT, Aug. 2008, 59 pages.

Shailesh More, *Aging Degradation and Countermeasures in Deep-submicrometer Analog and Mix Signal Integrated Circuits*, Munich University, Apr. 30, 2012, 153 pages.

Florian Raoul Chouard, *Device Aging in Analog Circuits for Nanoelectronic CMOS Technologies*, Munich University, Apr. 25, 2012, 166 pages.

EP Search Report issued in EP Patent Application Serial No. 16158456.0 mailed Oct. 12, 2016, 12 pages.

Kavya Vittala et al., *Early Lifetime Failure Detection in FPGAs Using Delay Faults*, 978-1-4799-4689-1/14 © 2014 IEEE, 6 pages.

Jyothi Bhaskarr et al., *Failure Analysis of Asymmetric Aging Under NBTI*, IEEE Transactions on Device and Materials Reliability, vol. 13, No. 2, Jun. 2013, 1530-4388 © 2012 IEEE, 10 pages.

* cited by examiner

LIMITING AGING EFFECTS IN ANALOG DIFFERENTIAL CIRCUITS

PRIORITY DATA

This application is a non-provisional of U.S. Provisional Patent Application Ser. No. 62/131,725, filed Mar. 11, 2015, which is hereby incorporated by reference in its entirety.

TECHNICAL FIELD OF THE DISCLOSURE

The invention relates to the field of integrated circuits, in particular to limiting and systematically reversing aging effects in analog differential circuits.

BACKGROUND

Integrated circuits processes electrical signals to produce rich electronic applications. One dominant type of devices making up these integrated circuits is the metal-oxide semiconductor (MOS) devices. Technology advances have allowed MOS devices to be produced using deep nanometer complementary metal-oxide semiconductor (CMOS) processes, for example 65 nanometer (nm) nodes and smaller. While these devices allow many integrated circuits to become more compact, faster, and/or more powerful, these devices can suffer from so-called "aging effects". In simple terms, over time, during active operation, aging's net effect is that the MOS devices' characteristics experience individual parametric drifts depending on their operating conditions including their quiescent point, their large signal operation, and the their temperature. Different devices can age in different amounts depending on the individual operating conditions within the same die or even the same circuit.

"Aging Degradation and Countermeasures in Deep-submicrometer Analog and Mixed Signal Integrated Circuits" by Shailesh More (Apr. 30, 2012) and "Device Aging in Analog Circuits for Nanoelectronic CMOS Technologies" by Florian Raoul Chouard (Apr. 25, 2012) were two doctorate dissertations which examined aging degradation effects in analog and mixed signal circuits. The authors discussed countermeasures such as chopper stabilization, auto-zeroing techniques, and calibration techniques to address aging of devices.

OVERVIEW

Aging effects on devices fabricated using deep nanometer complementary metal-oxide semiconductor (CMOS) processes can cause circuits to exhibit an undesirable mismatch buildup over time. To address the aging effects, the connections to an array of M differential circuits are controlled to limit and systematically minimize or reverse the aging effects. In one embodiment, the controlling permutation sequence is selected to stress the array of M differential circuits under opposite stress conditions during at least two different time periods. Imposing opposite stress conditions, preferably substantially equal opposite stress conditions, can reverse the direction of a mismatch buildup and limit the mismatch buildup over time within acceptable limits. The controlling permutation sequence can be applied to an array of comparators of an analog-to-digital converter, or an array of differential amplifiers of a folding analog-to-digital converter.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Understanding Aging Effects

Degradation of metal-oxide semiconductor (MOS) devices negatively affects the performance and reliability of circuitry made up of these devices. For complementary metal oxide semiconductor (CMOS) devices fabricated using deep submicron process technologies, aging conditions (or stress conditions) imposed on CMOS devices and process, voltage, and temperature (PVT) variations can cause devices and circuits made up of these devices to degrade slowly over time. Aging conditions can include bias temperature instability, and conducting and non-conducting hot carrier injection in n-channel and p-channel metal-oxide semiconductor field effect transistor (MOSFET). These aging conditions stresses transistors, and can contribute to parameter shifts in transistors over time. It can be seen that the aging conditions can cause threshold voltage and drain current shifts. These shifts can mean that transistors under different or asymmetric aging conditions can be mismatched in their characteristic behaviors, thereby leading to degradation in accuracy of the circuitry.

Aging Effects on Differential Circuits, Such as a Comparator

Figure 1:
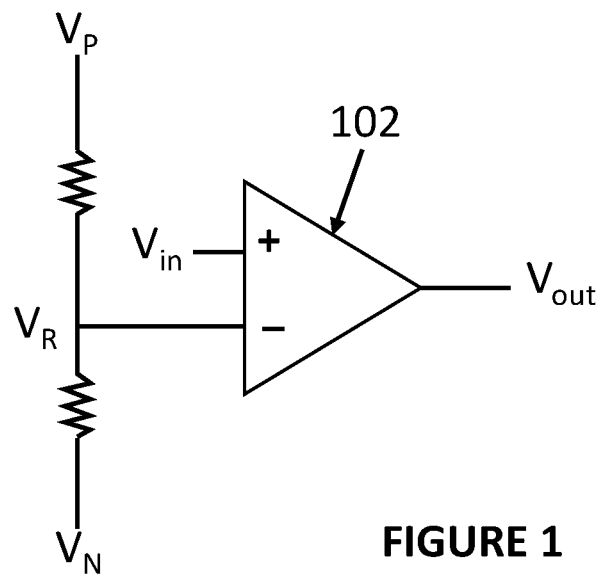
FIG. 1 shows circuit block diagram illustrating circuitry having a comparator having a quiescent condition.
Figure 2:
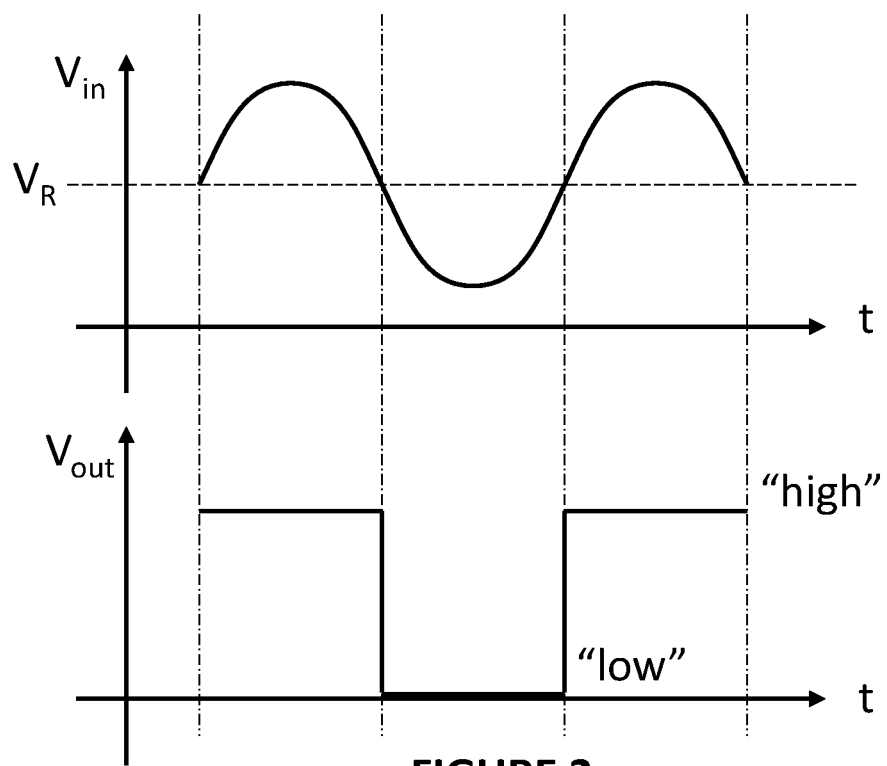
FIG. 2 shows the normal behavior of the circuitry of FIG. 1.

FIG. 1 shows circuit block diagram illustrating circuitry having a comparator having a quiescent condition. Specifically, the circuitry shows a commonly found arrangement, where an analog signal $V_{in}$ is applied to the positive input of a comparator 102, while the negative input is tied to an analog reference voltage $V_R$— a quiescent condition/point or bias point of the circuitry. FIG. 2 shows the normal behavior of the circuitry of FIG. 1. The comparator 102 provides an analog output $V_{out}$ that is "high" when $V_{in}>V_R$ and "low" otherwise.

The negative input of this comparator is held at $V_R$ (a quiescent condition) throughout the operation of the comparator. Conversely, its positive input to which the analog signal $V_{in}$ is applied varies within a pre-specified range, and, in most applications, its average value can be different from $V_R$. One example of a scenario where the average value of one input can be different from the other input of the comparator is the one of a flash analog-to-digital converter (ADC) where multiple (nominally identical) comparators sense the same input $V_{in}$, but each of their negative inputs are tied to different reference voltages $V_{R1}$, $V_{R2}$, etc. Thus, each one of such comparators operates with one of their two inputs (and so with one of its input devices) biased differently from the other input. In fact, since most commonly used input signals will swing around a direct current (DC) level that is placed around the middle of the reference voltages $V_{R1}$, $V_{R2}$, etc., the comparators with the highest and lowest reference voltages experience the largest systemic unbalance or amount of stress between their inputs for the longest operation time. If the input signal has an average To simplify, the amount of stress is correlated with the difference between their inputs and the amount of time the comparator experiences this difference. The greater the difference, the greater amount of stress. The longer time the comparator experiences this difference, the greater amount of stress. This applies to other types of differential circuits as well.

Since the two inputs of the comparator 102 of FIG. 1 are operating under different conditions (one fixed at $V_R$, and the other varying over time according to $V_{in}$), their two input devices at the positive input and the negative input and possibly some of the other devices in the internal comparator circuitry, age differently over time. Such condition causes different parametric shifts for each one of such devices. These systemic differences result into buildup of the parametric drift over time for as long as these different conditions persist. The greater amount of stress, the greater the buildup.

Figure 3:
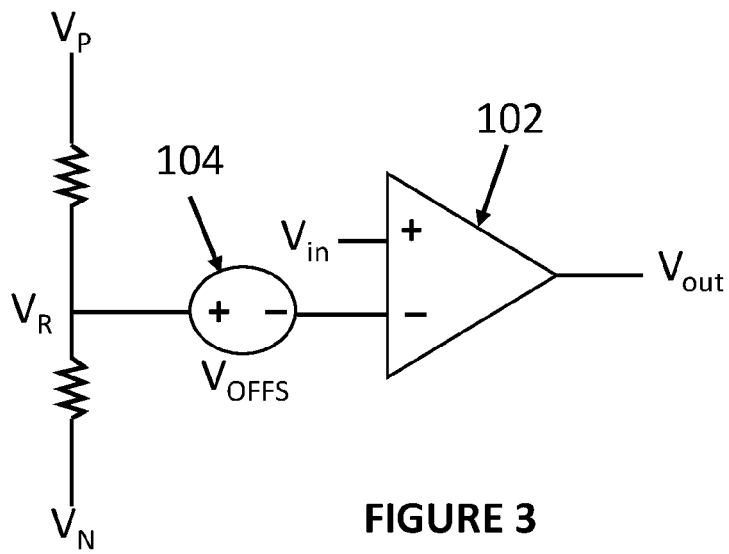
FIG. 3 shows a circuit block diagram illustrating circuitry having a comparator exhibiting aging effects as modeled by a directional offset buildup.
Figure 4:
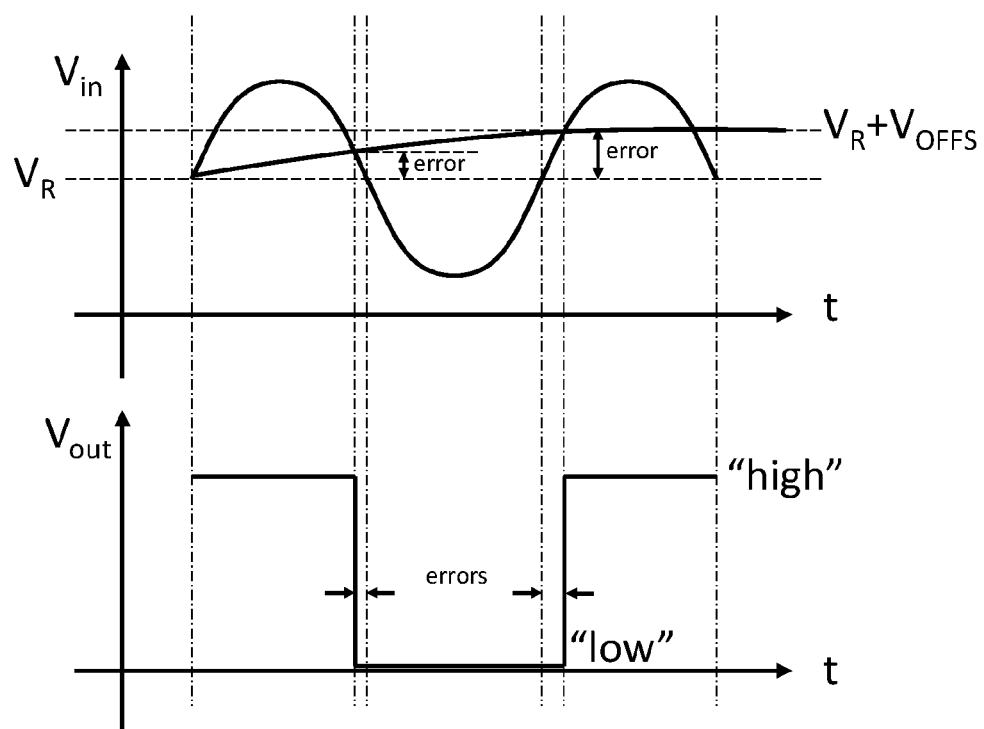
FIG. 4 shows the behavior of the circuitry of FIG. 3.

In a differential, or a balanced, analog circuit, such as a comparator or a differential amplifier, proper operation relies on matching designated devices and assumes such devices to operate with nominally identical electrical parameters. When there is an asymmetrical or unbalanced parametric shift, the circuit behavior can be modeled by an offset at one of the inputs. FIG. 3 shows a circuit block diagram illustrating circuitry having a comparator exhibiting aging effects as modeled by a directional offset buildup. The directional offset buildup is modeled by an additional voltage source $V_{OFFS}$ 104 placed in series with one of the inputs. FIG. 4 shows the behavior of the circuitry of FIG. 3. Similar to FIGS. 1 and 2, the comparator 102 provides an analog output $V_{out}$ that is "high" when $V_{in}>V_R$ and "low" otherwise. Because of the directional offset buildup, $V_R+V_{OFFS}$ (instead of $V_R$), is applied at the negative input, and it can be seen that errors are introduced in the behavior of $V_{out}$. The offset buildup grows continually in a particular direction over time, as depicted in the example shown in the time-domain diagrams of FIG. 4.

Direction Offset Buildup Associated with Aging is Uniquely Different from Other Offsets CMOS lithography and fabrication limitations can often introduce device mismatch leading to random offsets in comparators and all other analog circuits. However, these random offsets are distinctly different from the directional offset buildup associated with aging effects. In these cases, while the magnitude and sign of the random offset is unknown (yet, associated to a statistical distribution with predictable parameters), once the die is fabricated, such random offset due to lithography and fabrication limitations is expected to stay substantially constant over the lifetime of the device. However, aging in nanometer processes causes an additional drift over time, which equates to the directional offset buildup $V_{OFFS}$ as shown in FIGS. 3-4. If the conditions for the two inputs of our comparator are permanently asymmetric or different, then directional offset buildup also continues to grow over time in a particular direction. Within the context of the disclosure, aging effects are synonymous with the directional buildup offset.

Many circuit techniques and calibration algorithms have been developed over the past decades to measure and compensate for unknown but fixed offsets in comparators and amplifiers. The techniques and algorithms assume that the offset is fixed (as it is the case when that is uniquely due to manufacturing/lithography), while others may periodically measure the offset and therefore are able to continue to compensate for it even if this varies over time. But any one of these techniques assumes that such fixed offset stays bounded within a specified correction range. In other words, if the unknown offset falls outside a design-specific range (also known as "the compensation range") then the compensation will not work as intended. Since the offset due to aging continually builds up over time, the use of one of these traditional techniques may be insufficient as the offset could grow beyond the admissible "correction range" over time. Furthermore, aging can increase the required compensation range of the comparator, which leads to a more costly solution.

Chopper Stabilization to Systematically Limit and Reverse Aging

Figure 5:
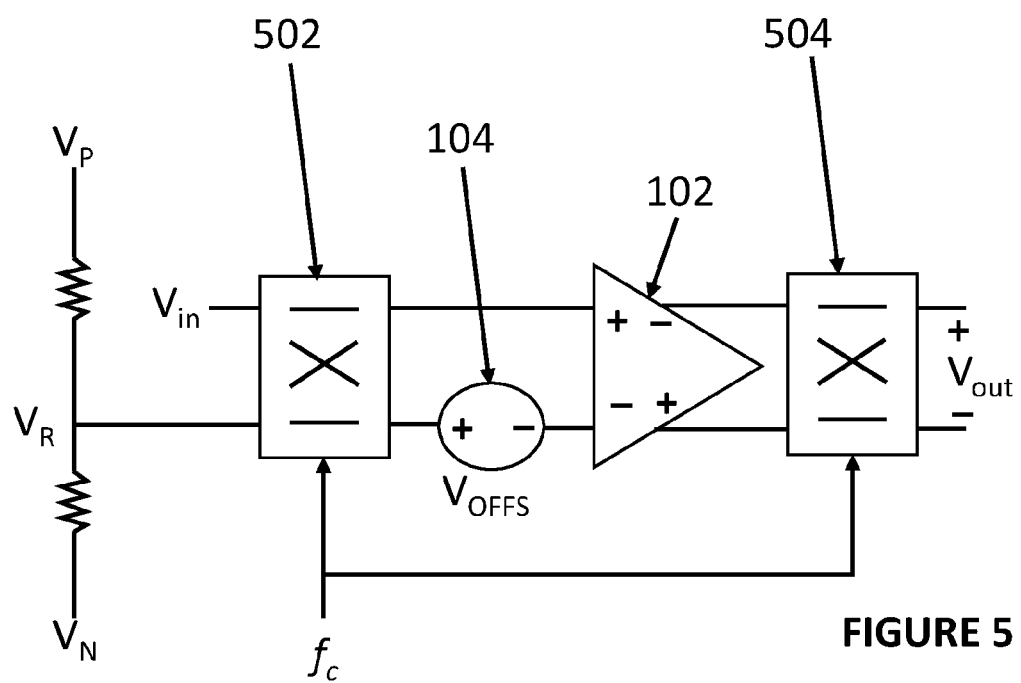
FIG. 5 shows an exemplary circuit block diagram illustrating circuitry having butterfly switches as a countermeasure to systematically reverse aging effects on a comparator, according to some embodiments of the disclosure.

One possible approach to address aging effect, i.e., the directional offset buildup, includes applying chopper stabilization to limit the offset within bounds instead of letting it build up (with the risk of going out of the compensation range). Chopper stabilization is implemented using a pair of butterfly switches—one butterfly switch at the inputs of the comparator and another butterfly switch at the outputs of the comparator. FIG. 5 shows an exemplary circuit block diagram illustrating circuitry having butterfly switches 502, 504 as a countermeasure to systematically reverse aging effects on a comparator, according to some embodiments of the disclosure. The method to reducing aging effects in balanced analog circuits such as comparator 102 includes switching, by butterfly switch 502, a pair of differential inputs of a balanced analog circuits, and switching, by butterfly switch 504, a pair of differential outputs of the balanced analog circuit. Through the switching mechanism, the offset buildup associated with aging effects reverses in direction when the orientation of the inputs/outputs are flipped by the butterfly switches 502, 504. The offset buildup caused by parametric drift of one or more devices of the balanced analog circuit is effectively limited or bounded over time.

Figure 6:
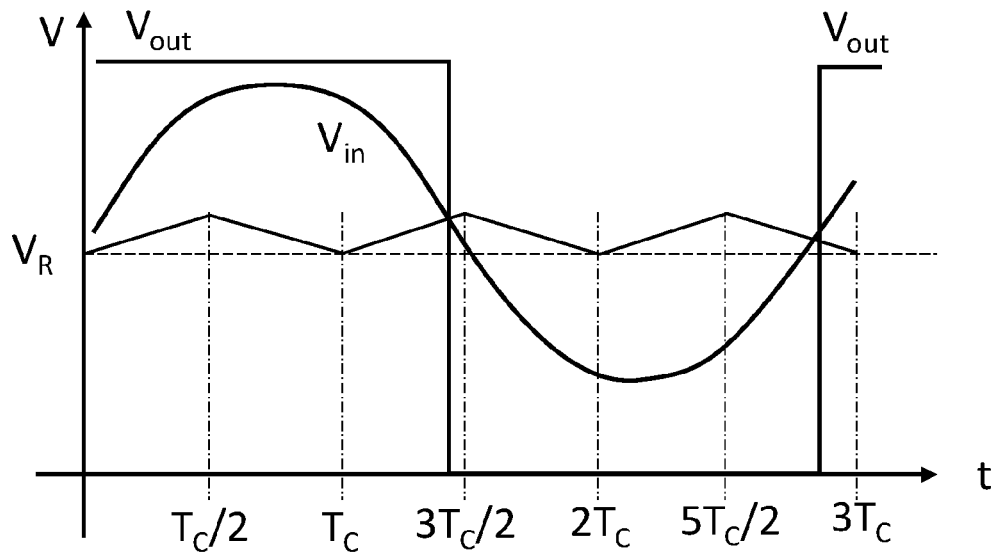
FIG. 6 shows the behavior of the circuitry of FIG. 5, according to some embodiments of the disclosure.
Figure 7:
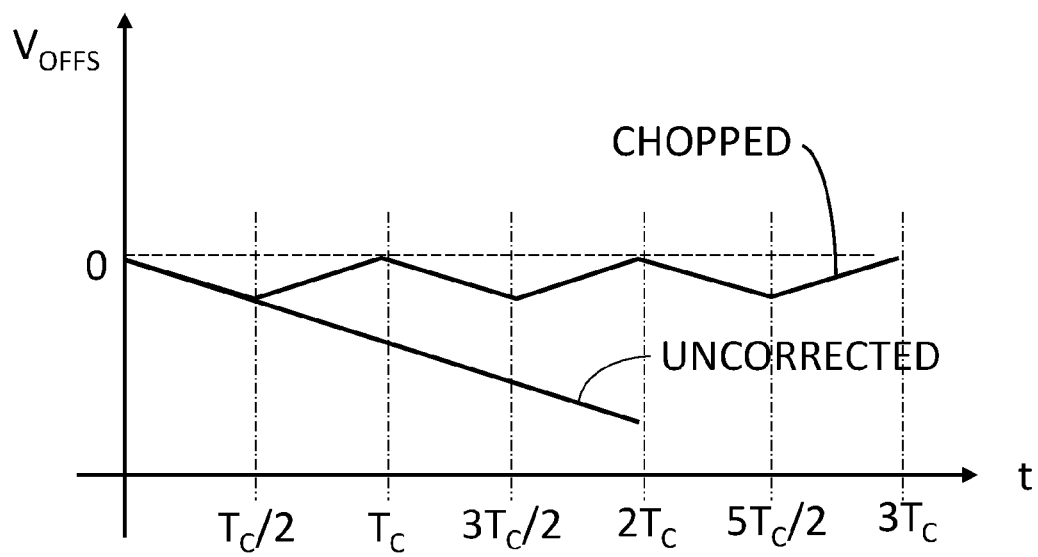
FIG. 7 contrasts an offset being limited by the countermeasure illustrated in FIG. 5 and an offset that is uncorrected, according to some embodiments of the disclosure.

FIG. 6 shows the behavior of the circuitry of FIG. 5, according to some embodiments of the disclosure, and FIG. 7 contrasts an offset being limited by the countermeasure illustrated in FIG. 5 and an offset that is uncorrected, according to some embodiments of the disclosure. The time-domain waveforms illustrate that the butterfly switch 502 introduced in front of the comparator differential inputs and the butterfly switch 504 introduced at the differential outputs of the comparator 102 reverses the direction of the offset buildup, limits or bounds the offset buildup, and thus limits the errors caused by aging.

During operation, the butterfly switches 502, 504 are controlled or operates with the same clock signal at frequency $f_c$ and period $T_c=1/f_c$. During the time period $0<t<T_c/2$, the butterfly switch 502 shorts its upper input to its upper output and its lower input to its lower output respectively. The same is true for the butterfly switch 504. Hence, $V_{in}$ is applied to the positive input while $V_R$ is applied to the negative input. On the output side, during the time period $0<t<T_c/2$, $V_{out}$ directly correspond to the differential outputs of the comparator 102. If left operating in this condition (uncorrected), since $V_R$ is applied to the negative input terminal, over time, the circuitry experiences an offset buildup, as seen in the time-domain waveform for $V_{OFFS}$ in FIG. 7.

When $t=T_c/2$, both butterfly switches 502 and 504 changes state, reverting the input-output mapping or connectivity. Therefore, between $T_c/2<t<T_c$, $V_{in}$ is applied to the negative input of the comparator 102 while $V_R$ is applied to the positive input of the comparator 102, while $V_{out}$ equals to the inverted differential outputs of the comparator 104. During this time, it is the positive input of the comparator to which $V_R$ is applied. Therefore, the stress conditions previously experienced by the negative input are reproduced on the positive input of the comparator 102 in an opposite manner. As such, the equal but opposite aging conditions, i.e., resulting in the directional offset is imposed on the second half of the comparator 102, and the direction of the offset buildup is reversed, progressively cancelling the previous offset drift.

The above described cycle continues identically during the following periods as depicted in FIG. 6. Therefore, the "chopped" offset remains bounded instead of progressively accumulating as in the case in which no chopper stabilization was applied, as exemplified in FIG. 7.

Those skilled in the art would appreciate that the offset buildup associated with aging can stay bounded even in the case in which the aging effects are affected by a hysteretic behavior as well as in the case in which a change in biasing condition for an aging device do not entirely restore its original characteristics. Furthermore, there aren't substantial conditions limiting the chopping frequency $f_c$, and $f_c$ can be derived from existing clock signal(s) of the system, such as the sampling frequency clock fs. In addition, the period $T_c$ can be set to be substantially long if so desired. In some cases, the period Tc is on the order of days or weeks. Aging effects, even in the case of high temperature and large biasing conditions, have long time constants. Nearly identical schemes can be also applied to differential amplifiers and other differential or balanced analog circuits, and hence obtain the very same benefits in bounding the offset buildup effect. It is noted that the chopper stabilization technique does not compensate for offset, rather, the chopper stabilization technique masks and possibly filters out the effect of the offset buildup through chopping modulation. Effectively, the directional offset buildup can be modulated to a band that is outside of the band of interest of the system. A filter, e.g., such as a high pass filter or some anti-aliasing filter can be used to filter the modulated offset out, if desired. After chopping modulation, the up-converted offset can be removed by means of suitable (analog) filtering. In some cases, there is no need to apply this post-filtering. The chopping scheme can keep the buildup bounded. Additional post-filtering can certainly be applied to remove residual offset effects, but it is not necessary for all applications.

Aging Comparators in Flash or Folding ADCs

Figure 8:
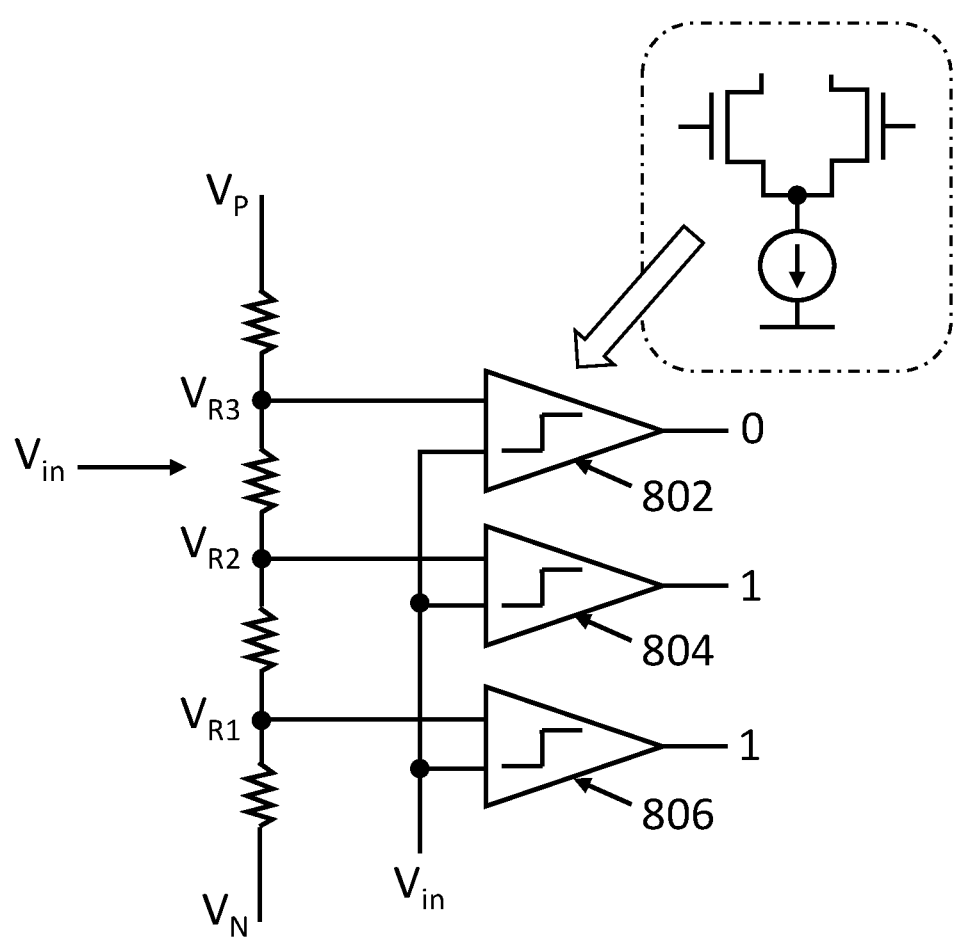
FIG. 8 shows an exemplary circuit block diagram illustrating circuitry having an array of comparators.

A flash analog-to-digital converter (ADC) is one many kinds of ADCs, and are embedded in many other architectures for analog-to-digital conversion. FIG. 8 shows an exemplary circuit block diagram illustrating circuitry having an array of comparators. The circuitry shown is an exemplary 2-bit flash ADC. The comparators 802, 804, 806 are tied to a different reference voltages $V_{R3}$, $V_{R2}$, and $V_{R1}$, respectively, at one input, and the comparators 802, 804, 806 are tied to the same variable input $V_{in}$. The circuitry exemplifies the scenario where asymmetric stress conditions are imposed on the three comparators 802, 804, 806. The different fixed reference voltages, e.g., from the resistor ladder, stresses the three comparators differently, e.g., at the input pre-amplifier stage of the comparator circuitry. For instance, the higher the value of the reference voltage, the more the input transistor device of the comparators 802, 804, 806 connected to the reference voltage is stressed due to the higher gate to source voltage. Input transistor devices of the comparators 802, 804, 806 connected to the variable input $V_{in}$ would experience the same amount of stress. If $V_{in}=V_N$, the stress conditions would induce a worst directional offset in the positive direction for comparator 802 (followed by comparator 804); if $V_{in}=V_P$, the (opposite) stress conditions would induce a directional offset in the negative (opposite direction) for comparator 806 (followed by comparator 804).

Figure 9:
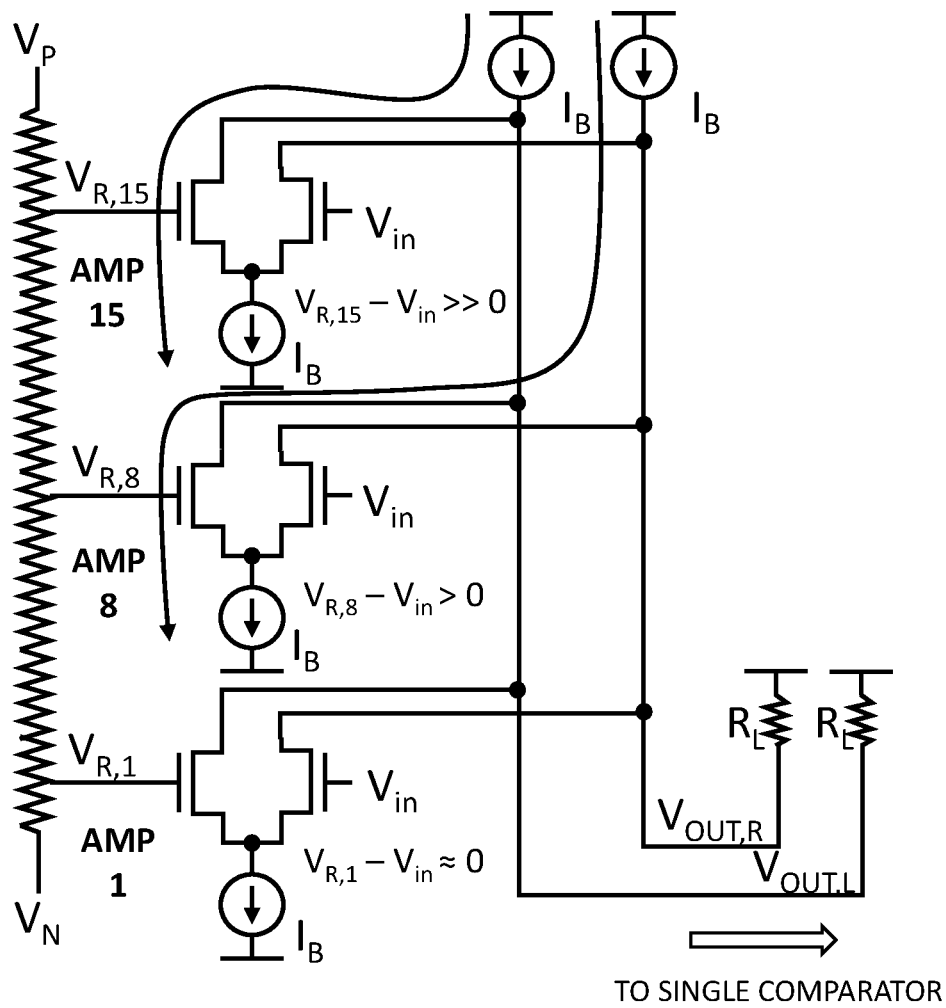
FIG. 9 shows an exemplary circuit block diagram illustrating circuitry having an array of differential amplifiers.
Figure 9:
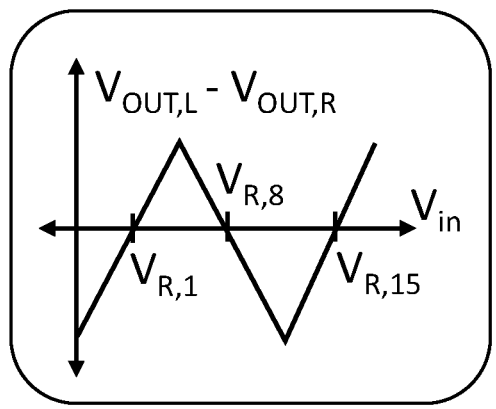

Due to asymmetric stress conditions imposed on the input devices (e.g., ones connected to the different reference voltages $V_{R1}$, $V_{R2}$, etc., and the variable input $V_{in}$), the three comparators 802, 804, 806, age differently over time, thus can exhibit different offset buildups. The offset buildups for each comparator can be different and, over time, as aging does it course, the respective offset buildups can diverge from one another even further. Such offset buildups, if not compensated or digitally corrected, can introduce undesirable linearity errors in the converter transfer characteristics. Furthermore, aging can result in offsets building up beyond the correction range of classic static offset cancellation techniques. The asymmetric stress conditions are also present in the case of a folding ADC as the one exemplified in FIG. 9, which shows an exemplary circuit block diagram illustrating circuitry having an array of differential amplifiers making up a folding structure. Instead of having an array of comparators (e.g., as in FIG. 8), the folding ADC uses a (single) comparator, and the ADC forms a quantized output (i.e., the digital representation of the analog input $V_{in}$) based on a collection of zero crossings of $V_{OUT,L}$-$V_{OUT,R}$. Furthermore, the asymmetric stress conditions can also be present for in other arrays of differential amplifiers, or arrays of balanced or differential analog circuits having these different stress conditions imposed on them over time.

Controlling Connections to an Array of Differential Circuits to Limit and Reverse Aging Effects To address asymmetric aging conditions on the array of M differential circuits, the connections to M differential circuits can be controlled or shuffled systematically and intelligently to limit and reverse the aging effects. Controlling the connections to the differential circuits over time systematically based on expected amount and direction of aging conditions of the differential circuits can ensure that the differential circuits can experience, over time, substantially same aging conditions averaged across the differential circuits. Equalizing the aging/stress conditions across the differential circuits can limit or bound the offset buildup. The offset buildup can be limited or bounded to the average offset. It is also possible to allow the differential circuits to all drift altogether so that the drift would not cause a non-linearity.

In some cases, it is even possible to ensure the differential circuits can experience, over time, substantially same aging conditions in both directions, e.g., input bias conditions that would result in opposite aging effects. Effectively, the mismatches or offset buildups associated with aging can be substantially mitigated or eliminated altogether. The controlling of the connections can be done on a regular basis, e.g., any time a flash ADC samples a new input $V_{in}$, or at a suitable moment where reversal of direction of offset buildup induced by aging is desired. Different permutations can be used to map the connections to control/shuffle signal paths. If the mismatches or asymmetric offset buildups can be limited or bounded, the linearity of the ADC can be improved.

Figure 10:
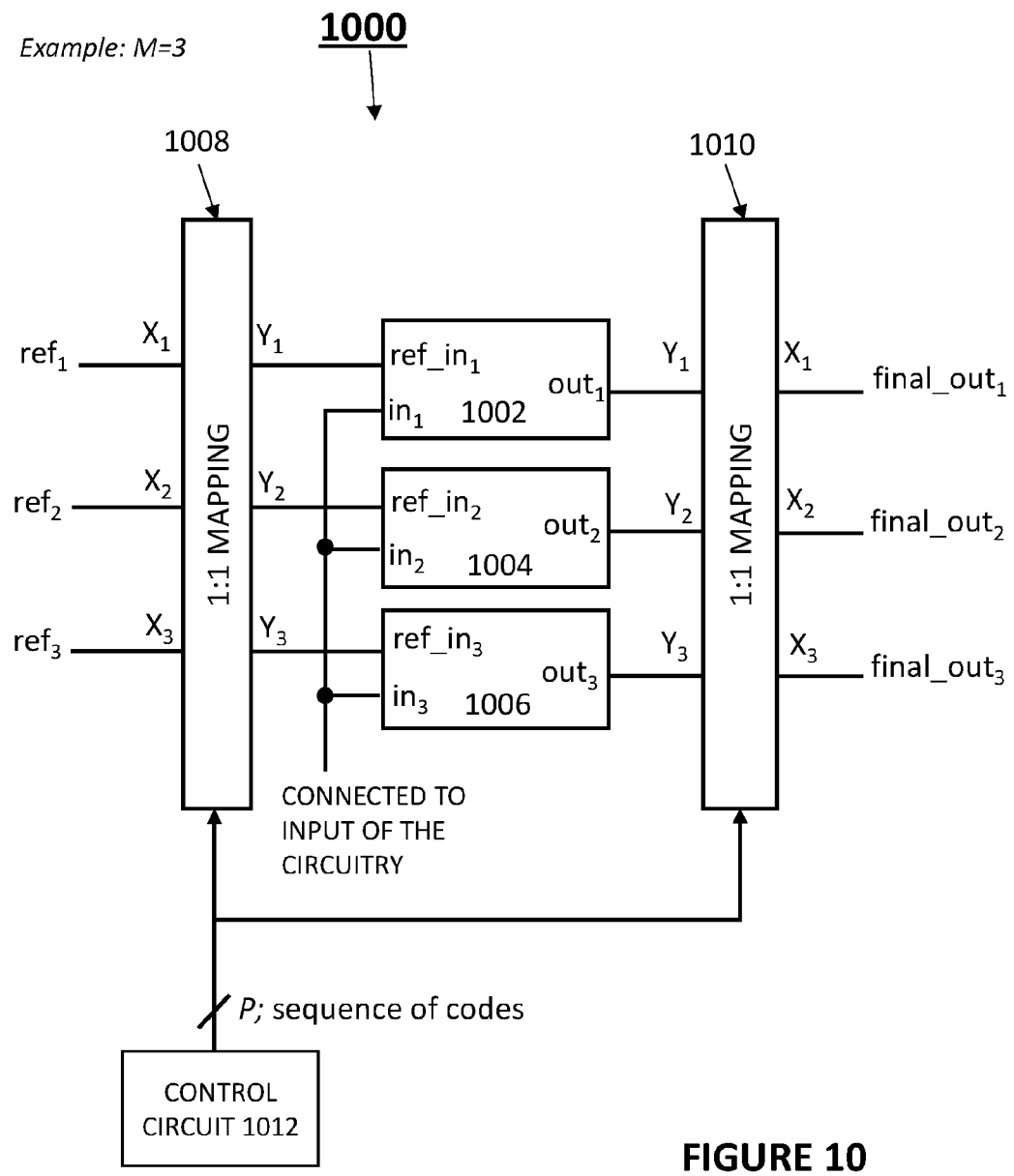
FIG. 10 shows an exemplary circuitry for limiting aging effects, according to some embodiments of the disclosure.

FIG. 10 shows an exemplary circuitry for limiting aging effects, according to some embodiments of the disclosure. A more general example is described with respect to FIGS. 13 and 14. The circuitry 1000 in FIG. 10 can be suitable for limiting aging effects through systematic and intelligent shuffling. The circuitry 1000 can include an array of M differential circuits (e.g., differential circuits 1002, 1004, 1006). While the example shown in FIG. 10 shows M=3 differential circuits, M can be 2, or greater than or equal to 3. The M differential circuits have respective reference input nodes (e.g., $ref\_in_{1\ldots M}$), respective variable input nodes (e.g., $in_{1\ldots M}$) connected to an input of the circuitry, and respective first variable output nodes (e.g., $out_{1\ldots M}$). In some cases, the M differential circuits can have further variable output nodes, e.g., the output nodes can include differential output pairs.

To implement the systematic and intelligent controlling/shuffling of connections through different permutations, the circuitry 1000 further includes an input connection network 1008 and a first output connection network 1010 (there can be more input/output connection networks). The input connection network 1008 and the first output connection network 1010 can be seen as switch boxes that can be controlled to provide desired connection networks to control/shuffle the differential circuit's inputs and outputs using different permutations. The input connection network 1008 and the first output connection network 1010 can be controlled by the same permutation code at a given time, but the network or one-to-one mapping of inputs and outputs being implemented by the input connection network 1008 and the first output connection network 1010 during that given time are inverses (e.g., inverted in orientation) of each other so as to ensure the outputs correctly correspond to the manner in which the inputs have been controlled/shuffled. The input connection network 1008 and the output connection network 1010 maintains/preserves the input-output relationships of the circuitry, as if the connection networks are not present. The signal paths within the circuitry 1000 are controlled/shuffled, but relationships between the reference signals and the final outputs are still preserved (e.g., $final\_out_m$ is still dependent on $ref_m$).

The circuitry 1000 can be a flash analog-to-digital converter, where the respective variable input nodes (e.g., $in_{1\ldots M}$) connected to an analog input, and the array of M differential circuits generates a digital representation of the analog input at the respective first variable output nodes (e.g., $out_{1\ldots M}$).

In the example shown, the input connection network 1008 connects the reference signals (e.g., $ref_{1\ldots M}$), e.g., reference voltages from a resistor ladder, to the reference input nodes (e.g., $ref\_in_{1\ldots M}$), e.g., one input of a differential amplifier or one input of a comparator, according to a first one-to-one mapping (1:1 mapping) during a first time period and a second one-to-one mapping during a second time period. The first output connection network 1010 connects first outputs of the circuitry (e.g., $final\_out_{1\ldots M}$) to the first variable output nodes (e.g., $out_{1\ldots M}$) according to the same first one-to-one mapping during the first time period and the same second one-to-one mapping during the second time period. The 1:1 mapping maps nodes $X_{1\ldots M}$ and nodes $Y_{1\ldots M}$ (or vice versa) in a one to one manner.

The circuitry 1000 further includes a control circuit 1012. In some cases, the control circuit 1012 can be configured to select the first one-to-one mapping and the second one-to-one mapping to stress at least some of the M differential circuits equally about the same over time (i.e., averaging stress conditions across multiple differential circuits). Equalizing stress conditions across at least some of the differential circuits can limit or bound the offset buildup, and/or reduce non-linearity. In some cases, the control circuit 1012 can select the first one-to-one mapping and the second one-to-one mapping to stress at least some of the M differential circuits under opposite stress conditions associated with aging (i.e., inducing offset buildups during the first period and the second period in opposite directions). Effectively, the opposite stress conditions during two or more different time periods (and preferably many different time periods) can, in some cases, reverse the direction of the offset buildup, thus allowing the aging effects, i.e., offset buildup, to be cancelled, mitigated, and/or bounded over time.

Besides systematically controlling/shuffling the M differential circuits during the first time period and the second time period, the control circuit 1012 can control/shuffle the M differential circuits over many time periods to achieve the limiting and possibly reversal of aging effects over time. The offset buildup associated with the stress conditions on the array of M differential circuits is bounded over time through different permutations (e.g., controlling or systematic shuffling of connections to the differential circuits). The systematic and intelligent controlling/shuffling can be done by controlling the connection networks through permutation codes. For instance, the control circuit 1012 can provide a sequence of permutation codes P corresponding to one-to-one mappings of the input connection network and the output connection network that controls/shuffles the connections over a plurality of time periods to substantially equalize opposite stress conditions on the array of M differential circuits. In some cases, the control circuit 1012 can provide a sequence of permutation codes P corresponding to one-to-one mappings of the input connection network and the output connection network that circularly rotates the connections over a plurality of time periods to substantially equalize opposite stress conditions on the array of M differential circuits.

Equalizing stress conditions across the differential circuits or equalizing opposite stress conditions on the array of M differential circuits is not trivial. In some embodiments, the reference signals (e.g., $ref_{1\ldots M}$) or reference voltages imposing different quiescent conditions asymmetrically stresses the array of M differential circuits, e.g., during any time period (e.g., during the first time period, during the second time period).

To systematically and intelligently control/shuffle connections to the M differential circuits, the first one-to-one mapping and the second one-to-one mapping are purposefully selected based on the reference signals (e.g., $ref_{1...M}$) and the asymmetrical stress conditions the reference signals imposes on the array of M differential circuits. In some embodiments, the circuitry, wherein states of the variable output nodes (e.g., $out_{1...M}$) asymmetrically stresses the array of M differential circuits during any time period (e.g., during the first time period, the second time period).

It is noted that the output nodes can provide an indication of the amount and direction of stress on output devices of a balanced/differential circuits (since output devices, e.g., latches, can experience aging as well). Output nodes can also indicate what the input signal was to derive stress conditions imposed on the differential circuits. To systematically and intelligently control/shuffle the M differential circuits, the second one-to-one mapping (or a further one-to-one mapping for controlling the input connection network and the first output connection network during a further time period) can be purposefully selected based (further) on the states of the variable output nodes (e.g., $out_{1...M}$) as feedback. Phrased differently, past (observed) states of variable output nodes (e.g., $out_{1...M}$) or output codes can provide an indication of the amount and direction of the offset buildup experienced by a differential circuit, and thus can be used to determine further one-to-one mapping(s) to be used to equalize and/or reverse the offset buildup in later time periods.

Example

Limiting Aging Effects in an Array of Comparators

Figure 11:
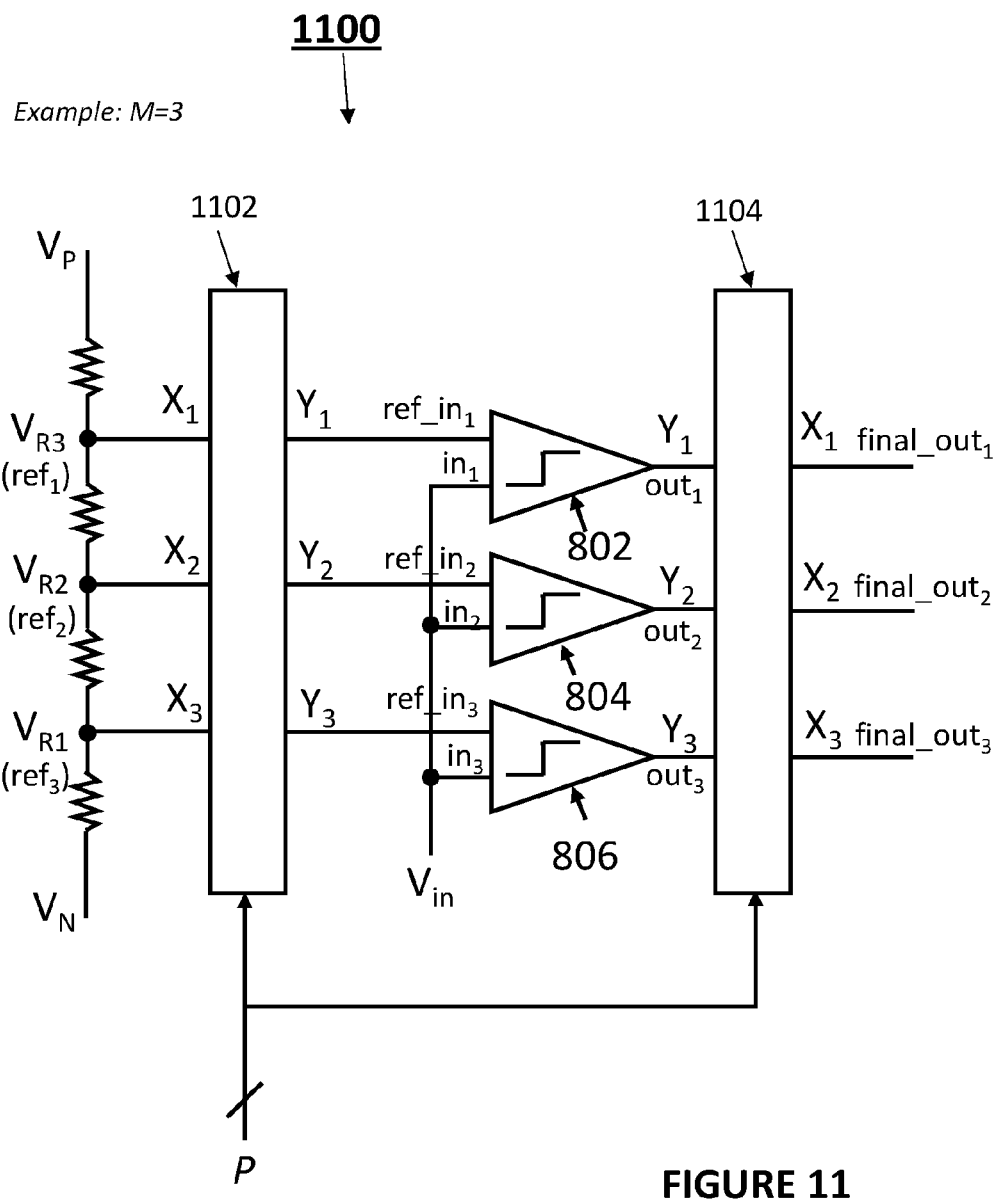
FIG. 11 shows an exemplary circuit block diagram illustrating one exemplary circuitry for limiting aging effects on an array of comparators, according to some embodiments of the disclosure.

FIG. 11 shows an exemplary circuit block diagram illustrating one exemplary circuitry 1100 suitable for limiting aging effects on an array of comparators, according to some embodiments of the disclosure. In this example, the M differential circuits of FIG. 11 comprises M comparator circuits configured to compare states of the variable input nodes (e.g., $in_{1...M}$) against states of the reference input nodes (e.g., $ref\_in_{1...M}$) and output the comparison at the first variable output nodes (e.g., $out_{1...M}$). It can be seen from FIG. 11 that the input connection network 1102 is added to the circuitry shown in FIG. 8, where the input connection network 1102 is placed between the reference ladder (generating reference signals/voltages $V_{R3}$, $V_{R2}$, and $V_{R1}$ in this example) and the reference inputs of array of comparators. Furthermore, an output connection network 1104 is added to the circuitry shown in FIG. 8, where the output connection network 1104 is placed between the outputs of the array of comparators and the flash ADC thermometric output.

As explained previously, the connection network can be implemented as a connection switchbox which can connect nodes $X_{1...M}$ and nodes according to a specified 1:1 mapping. A more general example of the connection network is explained with respect to FIGS. 13 and 14. The particular permutation, e.g., the 1:1 mapping, determining the connection network connecting nodes $X_{1...M}$ and nodes $Y_{1...M}$ is controlled by the digital permutation code P. For instance, code P=P0 can $X_1$ to $Y_1$, $X_2$ to $Y_2$, $X_3$ to $Y_3$; a different code P=P1 can short $X_1$ to $Y_2$, $X_2$ to $Y_3$, and $X_3$ to $Y_1$, and so on, for some or all possible permutations mapping connections between $X_{1...M}$ to outputs $Y_{1...M}$. The same permutation code P is used to control both the input connection network 1102, and the output connection network 1104, but the orientation of inputs and outputs of the input connection network 1102, and the orientation of nodes $X_{1...M}$ and nodes $Y_{1...M}$ of the output connection network 1104 are inverted with respect to the input connection network. The input connection network 1102 and the output connection network 1104 maintains/preserves the input-output relationships of the circuitry, as if the connection networks are not present. The signal paths within the circuitry 1100 are controlled/shuffled, but relationships between the reference signals and the final outputs are still preserved (e.g., $final\_out_m$ is still dependent on $ref_m$).

The permutation code P, in fact, a sequence of permutation codes can be used to shuffle (e.g., rotate) the order of the comparators over time. While three comparators are shown in this example, this systematic and intelligent controlling/shuffling can be extended to an arbitrary number of comparators. By controlling the connections to the comparators over time appropriately and on a regular basis (for example, any time the flash ADC samples a new input $V_{in}$), all comparators may experience, over time, equalizing stress across the comparators, and possibly opposite (or equal and opposite) aging conditions. In the case where stress conditions are equalized (or averaged) across the comparators, the offset buildup can be limited or mitigated, and possibly, the comparators can drift together so that it would result in less or no non-linearity. In the case where opposite, or equal and opposite aging conditions are imposed, the offset buildup can be reversed on a regular basis, the mismatches (and resulting loss of linearity) introduced by aging are substantially limited and in some cases mitigated or eliminated altogether.

In one example, the sequence of permutation codes can implement a "circular" rotation, where the first connection network 1102 and the second connection network 1104 can short $X_1$ to $Y_1$, then to $I_2$, then to $Y_3$ over three respective time periods, then again short $X_1$ to $Y_1$, then to $Y_2$, then to $Y_3$, and so on for further respective time periods, rotating the connections for $X_1$ to the three outputs in a round robin fashion. The time periods can be equal in duration, which can ensure that the top comparator (e.g., comparator 802) gets tied to all the reference voltages for the same amount of time. In one example, assuming that $V_{in}$'s average voltage is centered between $V_{R3}$ and $V_{R1}$, a possible offset build-up in one direction for the top comparator can be eventually countered by an equal and opposite buildup. The countering by the equal and opposite buildup or offset can cancel the initial parametric shift either entirely or partially. A more general example is described with respect to FIGS. 13 and 14, where $V_{in}$'s average voltage may not necessarily be centered between $V_{R3}$ and $V_{R1}$.

Example

Limiting Aging Effects in an Array of Differential Amplifiers (of a Folding ADC)

Figure 12:
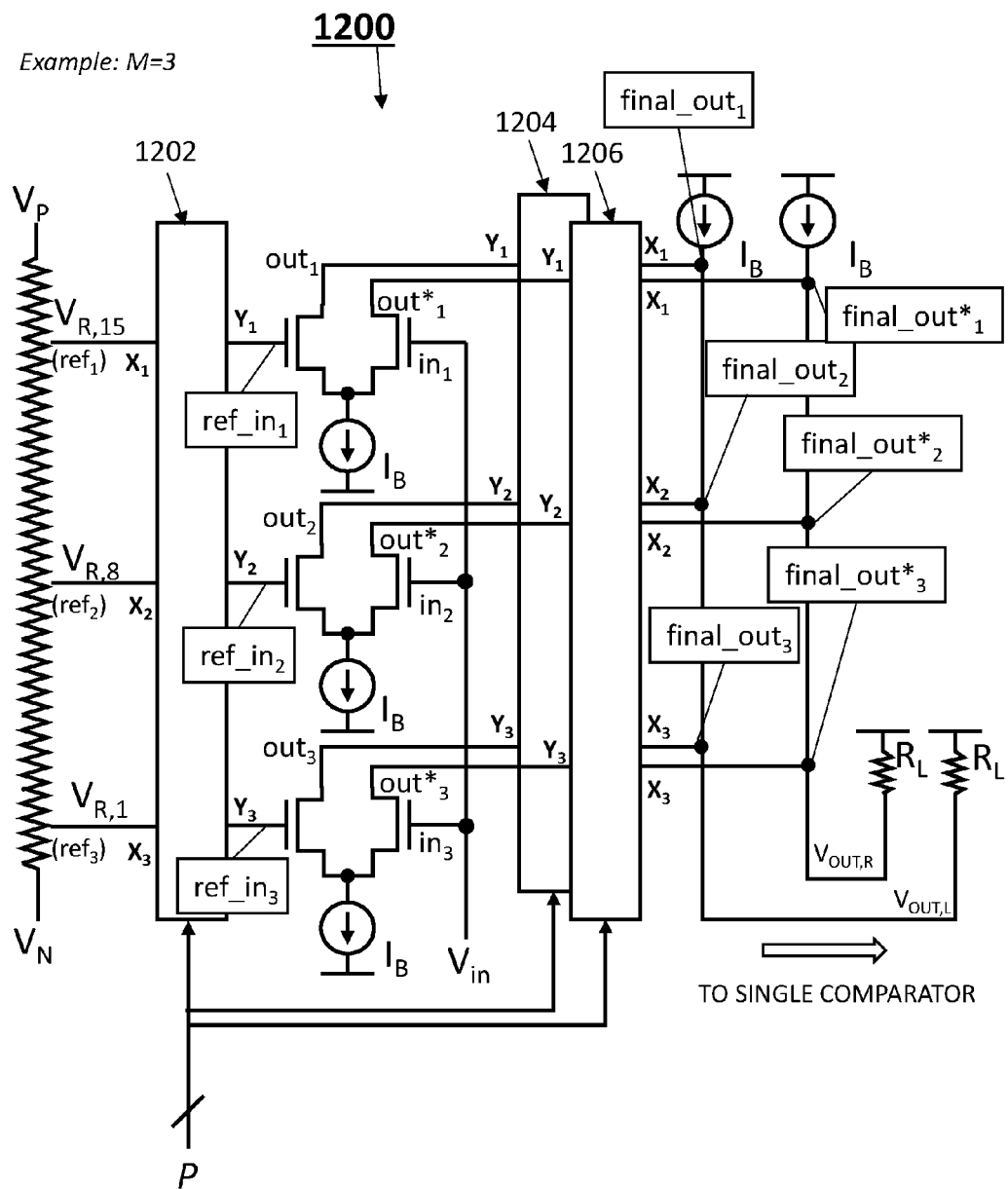
FIG. 12 shows an exemplary circuit block diagram illustrating one exemplary circuitry for limiting aging effects on an array of differential amplifiers, according to some embodiments of the disclosure.

FIG. 12 shows an exemplary circuit block diagram illustrating one exemplary circuitry 1200 suitable for limiting aging effects on an array of differential amplifiers, according to some embodiments of the disclosure. In the example shown, the M differential circuits of FIG. 12 comprises M differential amplifier circuits having the respective first variable output nodes (e.g., $out_{1...M}$) and respective second variable output nodes (e.g., $out^*_{1...M}$). In this folding structure, the first outputs of the circuitry (e.g., final_out$_{1...M}$) are tied to a first load line and the second outputs of the circuitry (e.g., final_out*$_{1...M}$) are tied to a second load line. The first and second load lines are connected to a comparator to generate a further output of the circuitry (e.g., an output whose collection of zero crossings represents the quantized version of the analog input V$_{in}$). The circuitry 1200 includes a first input connection network 1202 introduced between the reference taps of the resistor ladder (e.g., ref$_{1...M}$) and the reference inputs of the differential pairs/amplifiers (e.g., ref_in$_{1...M}$) shown in FIG. 9. The circuitry 1200 further includes a first output connection network 1204 and a second output connection network 1206 introduced between the output lines of the differential pairs/amplifiers and the load lines implementing the analog folding function on the right hand-side of the circuitry previously shown in FIG. 9. The second output connection network 1206 connects second outputs of the circuitry (e.g., final_out*$_{1...M}$) to the second variable output nodes (e.g., out*$_{1...M}$) according to the same first one-to-one mapping during the first time period and the same second one-to-one mapping during the second time period.

Similar to FIG. 11, the input/output connection networks are controlled by the same permutation code P and that the orientation of the input connection network on the left and the orientation of the two output connection network are reversed or inverted. Accordingly, the permutation code P determines the order in which each differential pair from the array in the center of the FIGURE is connected to each reference ladder tap and the corresponding folding connection on the right. Generally, the input connection network 1202, the output connection network 1204, and the output connection network 1206 maintains/preserves the input-output relationships of the circuitry, as if the connection networks are not present. The signal paths within the circuitry 1200 are controlled/shuffled, but relationships between the reference signals and the final outputs are still preserved (e.g., final_out$_m$ and final_out*$_m$ are still dependent on ref$_m$).

All the considerations previously made for the scheme illustrated in FIG. 11 in regards to the controlling of connections driven by a sequence of permutation codes also apply in the scheme illustrated in FIG. 12. For instance, rotation can be applied. In some cases, the systematic and intelligent controlling scheme shuffles or rotates signal paths through the differential pairs/amplifiers on a regular basis to ensure each of differential pairs/amplifiers experiences the same amount of aging conditions (averaging/equalizing). In some cases, the systematic and intelligent controlling scheme shuffles or rotates signal paths through the differential pairs/amplifiers on a regular basis to ensure each of the differential pairs/amplifiers experiences opposing aging conditions from one time period to another time period, preferably in substantially the same amount but under opposite stress conditions (thus opposite offset buildups).

Variations for Limiting Offset Buildup

As previously explained, the differential circuits may experience different amounts of aging. For instance, the amount of aging, or stress can depend on the difference between the average variable input and the fixed reference signal. When there are a range of reference voltages, e.g., V$_P$>ref$_1$>ref$_2$> . . . >ref$_M$>V$_N$, the differential circuits can experience different amounts of aging or stress (V$_P$ is the positive rail and the V$_N$ is the negative rail). In a basic example where V$_{in}$'s average voltage can be centered between ref$_1$ and ref$_M$, the differential circuits which are connected to higher reference voltages would have a positive offset buildup (higher the reference voltage the greater the positive offset buildup) and the differential circuits which are connected to the lower reference voltages would have a negative offset buildup (lower the reference voltage the greater the negative offset buildup). This basic example has pairs of equal and opposite stress conditions available to reverse the offset buildup over time by applying permutations which can swap the pairs of differential circuits having equal and opposite stress conditions over time to allow the buildup in opposite directions to cancel each other completely.

In some cases, V$_{in}$'s average voltage may not be centered between ref$_1$ and ref$_M$. There may not always be pairs of differential circuits which would undergo the equal and opposite stress conditions.

In one example, Vin's sits at V$_P$, and all of the differential circuits would all have different amounts of stress but all in the negative direction. Accordingly, there are no opposite stress conditions available to reverse the offset buildup. Some of the differential circuits can experience much greater stress than other ones. Using the connection networks, it is possible to control the amount of time the differential circuits are experiencing any one of the different stress conditions, and accordingly the total amount of stress on any given differential circuit can be limited. Instead of the unbounded offset (worst case), equalizing the stress conditions across the differential circuits can bound/limit the offset to the average stress condition (integrated over time). Bounding is very helpful because offset compensation (which is often limited in their range) is twice as difficult to implement for twice the offset. Besides bounding the offset, it is possible to use the input and output connections to shuffle connections to the differential circuits to equalize or average the stress across all the elements to fix non-linearity (by making sure they drift together the same amount in the same direction).

In another example, there are a plurality of reference signals ref$_{1...M}$, where M>2, and V$_{in}$'s average sits between ref$_1$ and ref$_2$ (i.e., V$_{in}$'s average is not in the middle between ref$_1$ and ref$_M$. The differential circuits would experience different amounts of stress, with one differential circuit (connected to ref$_1$) experiencing positive stress and the other differential circuits (connected to ref$_{2...M}$) experiencing different amounts of negative stress. In such a scenario, it is not possible to cancel out the offset completely using pairs of differential circuits with equal and opposite stress conditions since there are several differential circuits with negative stress and just one differential circuit with positive stress. However, if there are extra differential circuits, it might be possible to use extra differential circuits to cancel out the offset. Suppose the connection networks can switch the differential circuit (e.g., connected to ref$_M$) with the greatest amount of negative stress out for a few clock cycles and replace it with a redundant/extra element. Then the differential circuit connected to ref$_1$ can accumulate enough positive stress to cancel out the negative stress of the differential circuit connected to ref$_M$, assuming the amount of stress grows with time. With extra differential circuits, when one differential circuit is stressed a lot, it would be possible to switch it out for a while.

Accordingly, instead of connection network having a 1:1 mapping scheme, it is possible to have a connection network having an M:L connection scheme to accommodate extra differential circuits. In such cases, there are K additional differential circuit(s), and any one of them can be used for a given time period help either equalize stress conditions across differential circuit(s) and/or to impose opposite, or equal and opposite stress conditions. With additional differential circuits, it is possible to "switch in" or "switch out" certain differential circuits for purposes of reducing or reversing aging. By "switching out" a particular differential circuit, it is possible to reduce the amount of stress on the particular differential circuit. This can be used to help equalize the amounts of stress across various differential circuits, or even help to impose opposite, or equal and opposite amounts of stress on the differential circuits.

Figure 13:
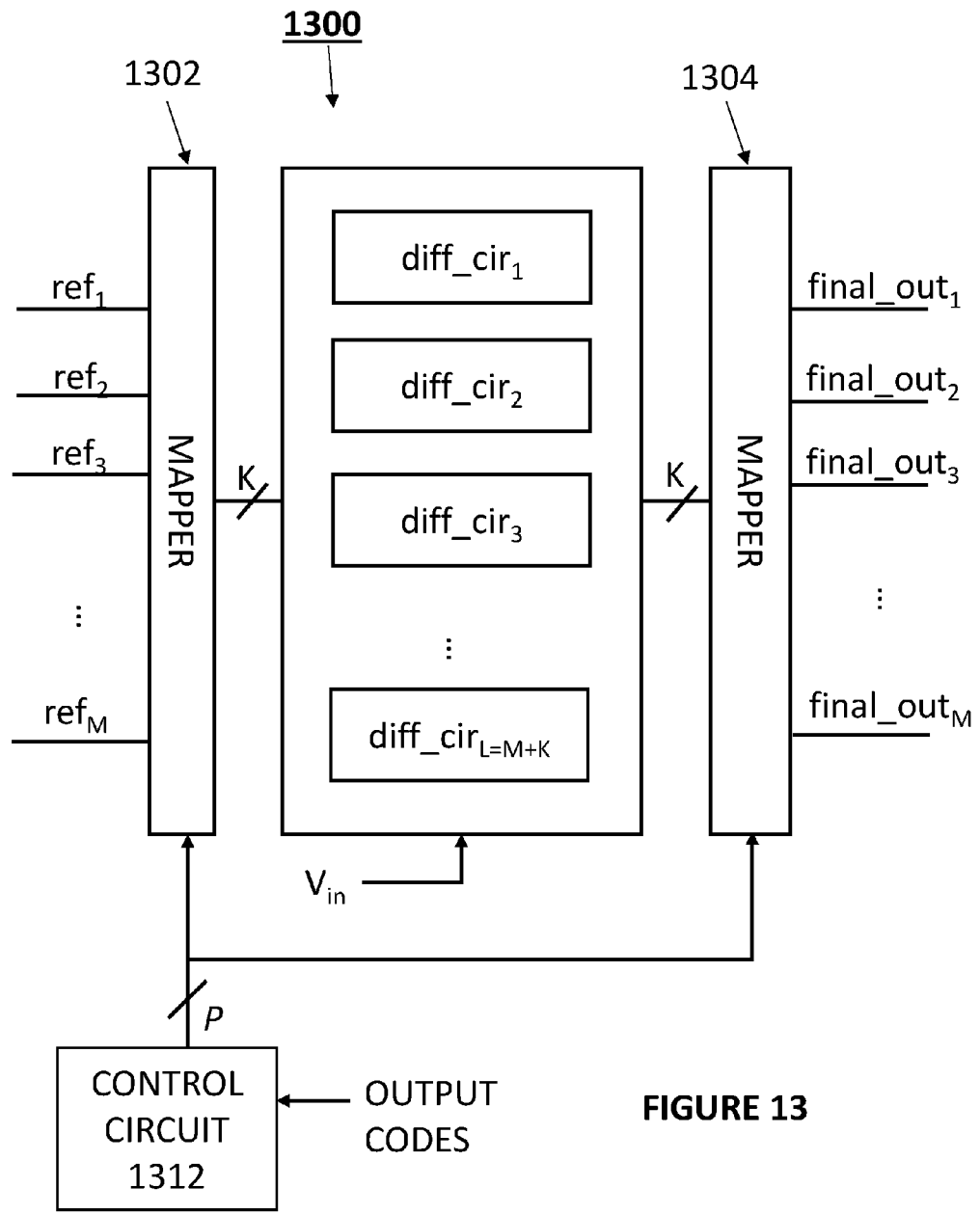
FIG. 13 shows an exemplary circuit block diagram illustrating exemplary circuitry for limiting aging effects on an array of differential circuits, according to some embodiments of the disclosure.

FIG. 13 shows an exemplary circuit block diagram illustrating exemplary circuitry for limiting aging effects on an array of differential circuits, according to some embodiments of the disclosure. In this example, there are L=M+K differential circuits (shown as diff_cir$_{1, \ldots L=M+K}$). During a given time period, only a subset of these differential circuits (M selected differential circuits from L=M+K differential circuits) are used to process the M reference signals (e.g., ref1, . . . M) and generate M final outputs (e.g., final_out$_{1 \ldots M}$). Accordingly, the permutations being applied would be subset-permutations, which routes M reference signals (e.g., ref$_{1 \ldots M}$) to reference input nodes of M selected differential circuits, and routes variable output nodes of M selected differential circuits to M final outputs (e.g., final_out$_{1 \ldots M}$).

The circuit 1300 for limiting aging effects on an array of differential circuits (e.g., diff_cir$_{1, 2, \ldots L=M+K}$) can include an input connection network 1302 for connecting reference signals (e.g., ref$_{1, 2, \ldots M}$) to reference input nodes of the array of differential circuits. The circuit 1300 further includes an output connection network 1304 for connecting output nodes of the array of differential circuits to final outputs. The circuit 1300 further includes a control circuit 1312 for outputting a first permutation code during a first time period to the input connection network and output connection network, and outputting a second permutation code during a second time period to the input connection network and the output connection network. The first permutation code and the second permutation code control signal paths through the array of differential circuits to limit stress conditions on at least one of the differential circuits over time while preserve relationships between the reference signals and the final outputs. When there are additional differential circuits, the input connection network 1302 connects reference signals to reference input nodes of selected ones of the differential circuits (based on the particular permutation used for the particular time period), and the output connection network 1304 connects variable output nodes of the selected ones of the differential circuits to the final outputs (based on the particular permutation used for the particular time period).

Similar to previous examples, the reference signals (e.g., ref$_{1 \ldots M}$) asymmetrically stress the array of differential circuits (or a subset of the array of differential circuits when extra differential circuits are available) during the first time period. Specifically, the reference signals can impose different stress conditions on selected ones of the differential circuits depending on the permutation. The array of differential circuits (e.g., diff_cir$_{1, 2, \ldots L=M+K}$) comprises respective variable input nodes for receiving a variable input signal, and differences between the variable input signal and respective reference signals can impose different stress conditions on the differential circuits.

Figure 14:
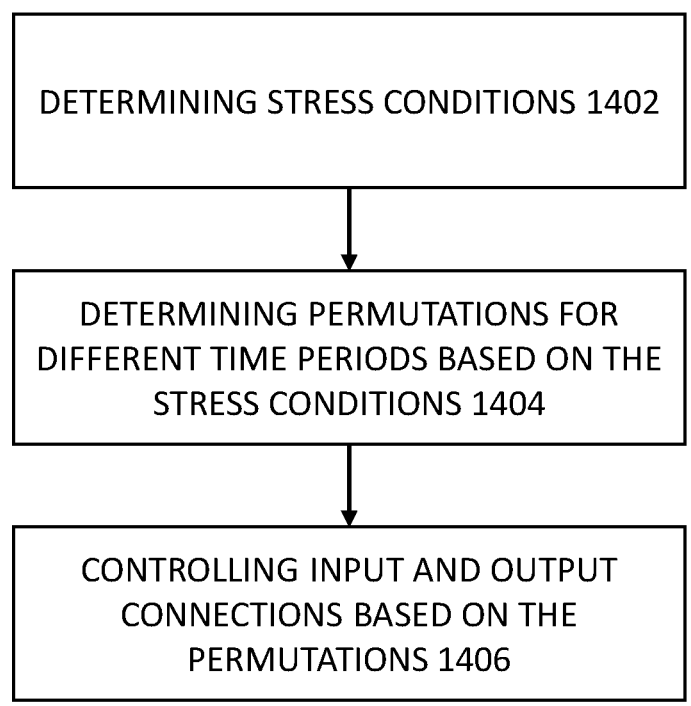
FIG. 14 shows a flow diagram illustrating a method for limiting aging effects on circuitry having an array of differential circuits, according to some embodiments of the disclosure.

In some embodiments, the control circuit 1312 observes output codes of the final outputs, and/or the output nodes of the differential circuits and outputs the first permutation code and the second permutation code based on the output codes. The output codes can provide an indication of how much stress each differential circuit is experiencing (thus provide feedback information), and the control circuit 1302 can determine the proper permutations to equalize stress conditions and/or impose opposite, or equal and opposite stress conditions to limit and possibly reverse the offset buildup. This can provide dynamic control and FIG. 14 shows a flow diagram illustrating a method for limiting aging effects on circuitry having an array of differential circuits, according to some embodiments of the disclosure. One or more parts of the method can be performed by a control circuit, which may include or be connected to one or more memory elements to store information associated with stress conditions and/or permutations. One or more parts of the method can be performed by the connection networks described herein.

The method can include determining stress conditions associated with aging on the array of differential circuits (task 1402). In some cases, stress conditions can vary depending on where the average of the variable input sits. As different permutations are used over time, the stress conditions imposed on the circuits would also change over time. Keeping track of the stress conditions thus aids in determining how to control the signal paths to equalize the stress conditions over time and/or impose opposite stress conditions to reduce or cancel offset build up. The method further includes, determining permutations for different time periods based on the stress conditions (task 1404). For instance, the method, can include determining first permutation of selected first ones of the differential circuits for a first time period and a second permutation of selected second ones of the differential circuits for a second time period, wherein said first and second permutations limit stress conditions on at least one of the differential circuits over time. The method further includes controlling input and output connections based on the permutations (task 1406). For example, the method can include controlling, during a first time period, input and output connections of the array of differential circuits based on the first permutation while maintaining input-output relationships of the circuitry, and controlling, during a second time period, input and output connections of the array of differential circuits based on the second permutation while maintaining the same input-output relationships of the circuitry.

In some embodiments, determining the stress conditions comprises determining average input to the array of differential circuits with respect to reference signals to the array of differential circuits. This may be an input-directed control scheme for limiting aging effects. In some embodiments, determining the stress conditions comprises using output codes of the circuitry (final outputs or output nodes of the differential circuits) to derive stress conditions on the array of differential circuits. This may be an output-directed control scheme for limiting aging effects.

The first permutation, the second permutation, and further permutations control signals paths through the array of differential circuits to substantially equalize stress conditions across at least some of the differential circuits such that an offset buildup associated with the stress conditions is bounded over time. In some cases, if possible, the first permutation, the second permutation, and further permutations control signals paths through the array of differential circuits to impose opposite (and in some cases opposite and equal) stress conditions on at least some of the differential circuits such that an offset buildup associated with the stress conditions is reversed.

The stress conditions comprises asymmetric stresses on the array of differential circuits due to differences between a variable input signal and reference signals to the array of differential circuits. Accordingly, the differential circuits undergo different amounts of stress, and in some cases, the offset can build up in different directions.

Determining the first permutation and the second permutation based on the stress conditions can include selecting one of the differential circuits for the first permutation to undergo a first amount of stress during the first time period, and selecting the same one of the differential circuits for the second permutation to undergo a second amount of stress during the second time period, wherein the second amount is less than the first amount. This alleviates the worst case offset buildup, and can potentially bound the offset buildup to the average.

Determining the first permutation and the second permutation based on the stress conditions can include selecting one of the differential circuits for the first permutation to undergo a first amount of stress during the first time period, and selecting the same one of the differential circuits for the second permutation to undergo a second amount of stress during the second time period, wherein the second amount is opposite from the first amount. This helps reverse the offset buildup.

When extra differential circuit(s) are available, the selected first ones of the differential circuits is a first subset of the differential circuits, and the selected second ones of the differential circuits is a second subset of the differential circuits. The first subset and the second subset can be the same (but the first permutation and the second permutation are still different), or the first subset and the second subset can be different (different selected ones of the differential circuits make up the first and second subsets). Having different subsets effectively allows certain differential circuits to be "switched out" so that the amount of stress can be reduced, and potentially be cancelled out by another opposite amount of stress in the circuitry. In an example, determining the first permutation and the second permutation based on the stress conditions comprises selecting a first one of the differential circuits for the first permutation to impose a first amount of stress on the first one of the differential circuits during the first time period, and not selecting the first one of the differential circuits as part of the second permutation to reduce stress condition on the first one of the differential circuits. In some cases, it may be possible to select the first one of the differential circuits for a further permutation to impose a second amount of stress on the first one of the differential circuits during a further time period, wherein the second amount of stress is substantially opposite to the first amount of stress.

Examples

Example 1 is a method for limiting aging effects of circuitry having an array of M (differential) circuits, the M (differential) circuits respective reference input nodes (ref_in1 . . . M), respective variable input nodes (in1 . . . M) connected to an input of the circuitry, and respective variable output nodes (out1 . . . M), the method comprising: connecting, using an input connection network, reference signals (ref1 . . . M) to the reference input nodes (ref_in1 . . . M) according to a first one-to-one mapping during a first time period; connecting, using an output connection network, outputs of the circuitry (final_out1 . . . M) to the variable output nodes (out1 . . . M) according to the same first one-to-one mapping during the first time period; connecting, using the input connection network, reference signals (ref1 . . . M) to the reference input nodes (ref_in1 . . . M) according to a second one-to-one mapping during a second time period; connecting, using the output connection network, outputs of the circuitry (final_out1 . . . M) to the variable output nodes (out1 . . . M) according to the same second one-to-one mapping during the second time period; and selecting, using a control circuit, the first one-to-one mapping and the second one-to-one mapping to stress at least some of the M (differential) circuits under opposite stress conditions associated with aging.

In Example 2, the method of Example 1 may further comprise: providing, by the control circuit, a sequence of permutation codes corresponding to one-to-one mappings of the input connection network and the output connection network that shuffles the connections over a plurality of time periods to substantially equalize opposite stress conditions on the array of M (differential) circuits.

In Example 3, the method of Example 1 or 2 may further include: providing, by the control circuit, a sequence of permutation codes corresponding to one-to-one mappings of the input connection network and the output connection network that circularly rotates the connections over a plurality of time periods to substantially equalize opposite stress conditions on the array of M (differential) circuits.

In Example 4, the method of any one of Examples 1-3, may further include an offset buildup associated with the stress conditions on the array of M (differential) circuits being bounded over time.

In Example 5, the method of any one of Examples 1-4, may further include the reference signals (ref1 . . . M) asymmetrically stressing the array of M (differential) circuits during the first time period.

In Example 6, the method of any one of Examples 1-5, may further include the first one-to-one mapping and the second one-to-one mapping being selected based on the reference signals (ref1 . . . M).

In Example 7, the method of any one of Examples 1-6, may further include states of the variable output nodes (out1 . . . M) asymmetrically stressing the array of M (differential) circuits during the first time period (or indicating asymmetrical stress conditions on the array of M (differential) circuits during the first time period).

In Example 8, the method of any one of Examples 1-7, may further include the second one-to-one mapping or a further one-to-one mapping for controlling the input connection network and the first output connection network being selected based on the states of the variable output nodes (out1 . . . M) as feedback.

Example 9 includes circuitry for limiting aging effects, comprising: an array of M (differential) circuits, wherein the M (differential) circuits have respective reference input nodes (ref_in1 . . . M), respective variable input nodes (in1 . . . M) connected to an input of the circuitry, and respective first variable output nodes (out1 . . . M); an input connection network configured to connect the reference signals (ref1 . . . M) to the reference input nodes (ref_in1 . . . M) according to a first one-to-one mapping during a first time period and a second one-to-one mapping during a second time period; a first output connection network configured to connect first outputs of the circuitry (final_out1 . . . M) to the first variable output nodes (out1 . . . M) according to the same first one-to-one mapping during the first time period and the same second one-to-one mapping during the second time period; and a control circuit configured to select the first one-to-one mapping and the second one-to-one mapping to stress at least some of the M (differential) circuits under opposite stress conditions associated with aging.

In Example 10, the circuitry of Example 9, may further include the M (differential) circuits comprising M comparator circuits configured to compare states of the variable input nodes (in1 . . . M) against states of the reference input nodes (ref_in1 . . . M) and output the comparison at the first variable output nodes (out1 . . . M).

In Example 11, the circuitry of Example 9 or 10, further comprising: the M (differential) circuits comprising M (differential) amplifier circuits having the respective first variable output nodes (out1 . . . M) and respective second variable output nodes (out*1 . . . M). The circuitry of Example 9 or 10 may further comprise: a second output connection network configured to connect second outputs of the circuitry (final_out*1 . . . M) to the second variable output nodes (out*1 . . . M) according to the same first one-to-one mapping during the first time period and the same second one-to-one mapping during the second time period.

In Example 12, the circuitry of any one of Examples 9-11, may further include: the first outputs of the circuitry (final_out1 . . . M) being tied to a first load line and the second outputs of the circuitry (final_out*1 . . . M) are tied to a second load line; the first and second load lines being connected to a comparator to generate a further output of the circuitry.

In Example 13, the circuitry of any one of Examples 9-12, may further include the control circuit being further configured to provide a sequence of permutation codes corresponding to one-to-one mappings of the input connection network and the output connection network that shuffles the connections over a plurality of time periods to substantially equalize opposite stress conditions on the array of M (differential) circuits.

In Example 14, the circuitry of any one of Examples 9-13, may further include the control circuit being further configured to provide a sequence of permutation codes corresponding to one-to-one mappings of the input connection network and the output connection network that circularly rotates the connections over a plurality of time periods to substantially equalize opposite stress conditions on the array of M (differential) circuits.

In Example 15, the circuitry of any one of Examples 9-14, may further include an offset buildup associated with the stress conditions on the array of M (differential) circuits being bounded over time.

In Example 16, the circuitry of any one of Examples 9-15, may further include the reference signals (ref1 . . . M) asymmetrically stressing the array of M (differential) circuits during the first time period.

In Example 17, the circuitry of any one of Examples 9-16, may further include the first one-to-one mapping and the second one-to-one mapping being selected based on the reference signals (ref1 . . . M).

In Example 18, the circuitry of any one of Examples 9-17, may further include states of the variable output nodes (out1 . . . M) asymmetrically stressing the array of M (differential) circuits during the first time period (or indicating asymmetrical stress conditions on the array of M (differential) circuits during the first time period).

In Example 19, the circuitry of any one of Examples 9-18, may further include the second one-to-one mapping or a further one-to-one mapping for controlling the input connection network and the first output connection network being selected based on the states of the variable output nodes (out1 . . . M) as feedback.

In Example 20, the circuity of any one of Examples 9-19, may further include: the circuitry being a flash analog-to-digital converter; the respective variable input nodes (in1 . . . M) connecting to an analog input; and the array of M (differential) circuits generating a digital representation of the analog input at the respective first variable output nodes (out1 . . . M).

VARIATIONS, APPLICATIONS, AND IMPLEMENTATIONS

It is envisioned for any of the embodiments disclosed herein that different shuffling and rotation sequences can impose biasing or stress conditions with equal and opposite aging effects onto the array of balanced circuits, hence limiting the parameter drift/offset buildup within desired bounds.

The term "offset" is used as an example of mismatch in the circuit. Embodiments described herein are applicable reversing/limiting buildup caused by various kinds of mismatches, including offset, differences in drive strength, differences in output currents, differences in bandwidths, differences in gain, etc.

While two examples of flash converters are shown, this technique can be applied to any comparator array in any flash ADC, or array of (differential) circuits in any suitable converter, to limit and possibly reverse aging effects. The time periods described herein may be the same over time (i.e., periodic shuffling), but the time periods may also be aperiodic or in part aperiodic if varying the time periods can equalize opposite stress conditions.

In some embodiments, an analog-to-digital converter comprises an array of differential circuits, wherein the differential circuits have respective reference input nodes, respective variable input nodes connected to analog input of the analog-to-digital converter, and respective first variable output nodes, an input connection network configured to connect the reference signals to the reference input nodes, a first output connection network configured to connect the first variable output nodes to first outputs, and a control circuit configured to control the input connection network and the first output connection network using a sequence of different permutation codes over (at least two, preferably many, e.g., hundreds or thousands of time periods) different time periods to limit an offset buildup associated with aging for at least some of the differential circuits. The control circuit can control the input connection network and the first output connection network to reverse an offset buildup associated with aging for at least some of the differential circuits.

In some cases, the differential circuits comprises comparator circuits configured to compare states of the respective variable input nodes against states of the respective reference input nodes and output the comparison at the first variable output nodes to generate a digital representation of the analog input.

In some cases, the differential circuits comprises differential amplifier circuits having the respective first variable output nodes and respective second variable output nodes, and the analog-to-digital converter further comprises a second output connection network configured to connect the second variable output nodes to second outputs. The first outputs of the circuitry can be tied to a first load line and the second outputs of the circuitry can be tied to a second load line. The first and second load lines are connected to a comparator to generate a further output of the circuitry.

While in many examples herein, the embodiments are described in relation to differential circuits (i.e., circuits having two inputs), it is envisioned by the disclosure that the embodiments herein can be used to reverse/limit offset buildup (or mismatch buildup) for other circuits have three, four, or more inputs.

Parts of various circuitry, e.g., the control circuit, can be implemented in a processor (on the same chip as the rest of the circuitry) or is controlled by a processor specially configured for selecting the permutation codes (i.e., the one-to-one mappings) described herein. For instance, the processor may include one or more application specific components, or may include programmable logic gates which are configured to carry out functions, e.g., selecting the permutation codes, described herein. The circuitry can operate in analog domain, digital domain, or in a mixed signal domain. In some instances, the processor may be configured to carrying out the functions described herein by executing one or more instructions stored on a non-transitory computer medium.

Generally speaking, the techniques described herein are applicable to data converters, which can be found in many different applications where performance is desired over a relatively long lifetime of the device, especially with devices fabricated with submicron processes. Applications may include medical systems, scientific instrumentation, wireless and wired communications, radar, industrial process control, audio and video equipment, current sensing, instrumentation, and other converter based systems. Moreover, certain embodiments discussed above can be provisioned in applications having an ADC in connection with digital signal processing applications in medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that have an ADC in connection with process control systems that help drive productivity, energy efficiency, and reliability. In consumer applications, the teachings of the signal processing circuits discussed above can be used in applications have an ADC in connection with signal processing technologies such as image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the control circuit may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of components or devices, operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions limiting aging effects, illustrate only some of the possible functions that may be carried out by, or within, circuitry illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for limiting aging effects on circuitry having an array of circuits, the method comprising:
    determining stress conditions associated with aging on the array of circuits;
    determining, based on the stress conditions, a first permutation of selected first ones of the circuits for a first time period and a second permutation of selected second ones of the circuits for a second time period, wherein said first and second permutations limit stress conditions on at least one of the circuits over time; and
    controlling, during a first time period, input and output connections of the array of circuits based on the first permutation while maintaining input-output relationships of the circuitry; and
    controlling, during a second time period, input and output connections of the array of circuits based on the second permutation while maintaining the same input-output relationships of the circuitry.

2. The method of claim 1, wherein:
    determining the stress conditions comprises determining average input to the array of circuits with respect to reference signals to the array of circuits.

3. The method of claim 1, wherein:
    determining the stress conditions comprises using output codes of the circuitry to derive stress conditions on the array of circuits.

4. The method of claim 1, wherein the first permutation, the second permutation, and further permutations control signal paths through the array of circuits to substantially equalize stress conditions across at least some of the circuits such that a mismatch buildup associated with the stress conditions is bounded over time.

5. The method of claim 1, wherein the first permutation, the second permutation, and further permutations control signal paths through the array of circuits to impose opposite stress conditions on at least some of the circuits such that a mismatch buildup associated with the stress conditions is reversed.

6. The method of claim 1, wherein the stress conditions comprises asymmetric stresses on the array of circuits due to differences between a variable input signal and reference signals to the array of circuits.

7. The method of claim 1, wherein determining the first permutation and the second permutation based on the stress conditions comprises:
    selecting one of the circuits for the first permutation to undergo a first amount of stress during the first time period; and
    selecting the same one of the circuits for the second permutation to undergo a second amount of stress during the second time period, wherein the second amount is less than the first amount.

8. The method of claim 1, wherein determining the first permutation and the second permutation based on the stress conditions comprises:
    selecting one of the circuits for the first permutation to undergo a first amount of stress during the first time period; and
    selecting the same one of the circuits for the second permutation to undergo a second amount of stress during the second time period, wherein the second amount is opposite from the first amount.

9. The method of claim 1, wherein:
    the selected first ones of the circuits is a first subset of the circuits, and the selected second ones of the circuits is a second different subset of the circuits.

10. The method of claim 9, wherein determining the first permutation and the second permutation based on the stress conditions comprises:
    selecting a first one of the circuits for the first permutation to impose a first amount of stress on the first one of the circuits during the first time period; and
    not selecting the first one of the circuits as part of the second permutation to reduce stress condition on the first one of the circuits.

11. The method of claim 10, further comprising:
    selecting the first one of the circuits for a further permutation to impose a second amount of stress on the first one of the circuits during a further time period, wherein the second amount of stress is substantially opposite to the first amount of stress.

12. Circuitry for limiting aging effects on an array of differential circuits, the circuitry comprising:
    an input connection network for connecting reference signals to reference input nodes of the array of differential circuits;
    an output connection network for connecting output nodes of the array of differential circuits to final outputs; and a control circuit for outputting a first permutation code during a first time period to the input connection network and output connection network, and outputting a second permutation code during a second time period to the input connection network and the output connection network;

wherein the first permutation code and the second permutation code control signal paths through the array of differential circuits to limit stress conditions on at least one of the differential circuits over time while preserve relationships between the reference signals and the final outputs.

13. The circuitry of claim 12, wherein:
the reference signals asymmetrically stress the array of differential circuits during the first time period.

14. The circuitry of claim 12, wherein:
the array of differential circuits comprises respective variable input nodes for receiving a variable input signal; and
differences between the variable input signal and respective reference signals impose different stress conditions on the differential circuits.

15. The circuitry of claim 12, wherein the control circuit observes output codes of the final outputs and outputs the first permutation code and the second permutation code based on the output codes.

16. An analog-to-digital converter comprising:
an array of differential circuits, wherein the differential circuits have respective reference input nodes, respective variable input nodes connected to analog input of the analog-to-digital converter, and respective first variable output nodes;
an input connection network configured to connect the reference signals to the reference input nodes;
a first output connection network configured to connect the first variable output nodes to first outputs; and
a control circuit configured to control the input connection network and the first output connection network using a sequence of different permutation codes over different time periods to limit a mismatch buildup associated with aging for at least some of the differential circuits.

17. The analog-to-digital converter of claim 16, wherein the control circuit controls the input connection network and the first output connection network to reverse a mismatch buildup associated with aging for at least some of the differential circuits.

18. The analog-to-digital converter of claim 16, wherein the differential circuits comprises comparator circuits configured to compare states of the respective variable input nodes against states of the respective reference input nodes and output the comparison at the first variable output nodes to generate a digital representation of the analog input.

19. The analog-to-digital converter of claim 16, wherein:
the differential circuits comprises differential amplifier circuits having the respective first variable output nodes and respective second variable output nodes; and
the analog-to-digital converter further comprises a second output connection network configured to connect the second variable output nodes to second outputs.

20. The analog-to-digital converter of claim 19, wherein:
the first outputs of the circuitry are tied to a first load line and the second outputs of the circuitry are tied to a second load line; and
the first and second load lines are connected to a comparator to generate a further output of the circuitry.

* * * * *